US008403601B2

(12) United States Patent
Yano et al.

(10) Patent No.: US 8,403,601 B2
(45) Date of Patent: Mar. 26, 2013

(54) SUBSTRATE TRANSFER APPARATUS AND SUBSTRATE TREATMENT SYSTEM

(75) Inventors: Mitsuteru Yano, Koshi (JP); Yuichi Douki, Koshi (JP); Hiroshi Tomita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 343 days.

(21) Appl. No.: 12/656,324

(22) Filed: Jan. 26, 2010

(65) Prior Publication Data

US 2010/0211215 A1 Aug. 19, 2010

(30) Foreign Application Priority Data

Feb. 18, 2009 (JP) ................................ 2009-035579

(51) Int. Cl.
*B65G 53/40* (2006.01)

(52) U.S. Cl. .............. 406/155; 408/19; 408/84; 408/88; 414/676; 414/935; 700/230

(58) Field of Classification Search .................... 406/19, 406/84, 88, 155; 414/676, 935; 700/230
See application file for complete search history.

(56) References Cited

U.S. PATENT DOCUMENTS

| 3,645,581 | A | * | 2/1972 | Lasch et al. ..................... 406/31 |
| 3,730,595 | A | * | 5/1973 | Yakubowski .................... 406/72 |
| 3,731,823 | A | * | 5/1973 | Goth ................................ 406/88 |
| 3,923,342 | A | * | 12/1975 | Shannon .......................... 406/10 |
| 3,945,505 | A | * | 3/1976 | Frisbie et al. .............. 414/331.14 |
| 4,425,075 | A | * | 1/1984 | Quinn ........................... 414/755 |
| 4,674,939 | A | * | 6/1987 | Maney et al. .................. 414/292 |
| 6,045,299 | A | * | 4/2000 | van Kessel et al. ............. 406/86 |
| 6,426,303 | B1 | * | 7/2002 | Ueda ............................. 438/716 |
| 6,447,217 | B1 | * | 9/2002 | Toda et al. ...................... 406/88 |
| 7,014,415 | B2 | * | 3/2006 | Yoshizawa ................. 414/797.5 |
| 7,908,995 | B2 | * | 3/2011 | Inamasu et al. ............... 118/300 |
| 2003/0008501 | A1 | * | 1/2003 | Bakli et al. ..................... 438/653 |
| 2005/0287821 | A1 | * | 12/2005 | Higashi et al. ................ 438/780 |
| 2009/0047103 | A1 | * | 2/2009 | Inamasu et al. .......... 414/222.01 |

FOREIGN PATENT DOCUMENTS

| JP | A-08-046010 | 2/1996 |
| JP | A-2000-272752 | 10/2000 |
| JP | A-2005-243690 | 9/2005 |
| JP | A-2006-287178 | 10/2006 |

OTHER PUBLICATIONS

Decision to Grant a Patent dated May 9, 2011 issued by the Japanese Patent Office in the corresponding Japanese Patent Application No. 2009-035579 (English translation enclosed).
Office Action mailed Feb. 22, 2011 issued in the corresponding Japanese Patent Application No. 2009-035579 (English translation enclosed).

* cited by examiner

*Primary Examiner* — Joseph A Dillon, Jr.
(74) *Attorney, Agent, or Firm* — Posz Law Group, PLC

(57) ABSTRACT

The present invention is a transfer apparatus for a substrate, including a substrate housing container housing a substrate therein and having a transfer-in/out port for the substrate formed in a side surface thereof; a gas jet unit jetting a predetermined gas toward a rear surface of the substrate in the substrate housing container; and a control unit regulating a supply amount of the predetermined gas supplied from the gas jet unit to control the substrate in the substrate housing container to a predetermined height.

14 Claims, 18 Drawing Sheets

SUBSTRATE TRANSFER APPARATUS AND SUBSTRATE TREATMENT SYSTEM

BACKGROUND OF THE INVENTION

1. Field of the Invention

The present invention relates to a transfer apparatus for a substrate such as a semiconductor wafer or the like, and a substrate treatment system having the substrate transfer apparatus.

2. Description of the Related Art

In a photolithography processing in a manufacturing process of a semiconductor device, for example, resist coating treatment of applying a resist solution onto a substrate such as a semiconductor wafer or the like to form a resist film, exposure processing of exposing the resist film to a predetermined pattern, developing treatment of developing the exposed resist film and so on are performed.

A series of the treatments and processing is usually performed using a coating and developing treatment system. The coating and developing treatment system has a cassette station for transferring in/out substrates, for example, in a unit of cassette, a treatment station in which a plurality of treatment apparatuses performing various treatments are arranged, an interface station for delivering the substrate between an adjacent aligner and the treatment station and so on. Further, in the treatment station, a substrate transfer apparatus transferring the substrate to the treatment apparatuses is provided.

For a conventional substrate transfer apparatus, for example, a transfer arm is used which includes a main body portion formed in a substantially circular shape and a holding portion projecting to the inside of the main body portion to hold the lower surface of the substrate. The transfer arm is configured to be movable in the vertical direction and the horizontal direction and rotatable. With this configuration, the substrate transfer apparatus can transfer the substrate to the treatment apparatuses (Japanese Laid-open Patent Publication No. Hei 8-46010).

However, when the transfer arm in the prior art transfers the substrate, a particle adheres to the substrate at a contact surface between the transfer arm and the substrate. The particle is a factor that reduces the yield of products manufactured by the substrate treatment system, bringing about a non-negligible problem with advancement in miniaturization of line width.

SUMMARY OF THE INVENTION

The present invention has been made in consideration of the above point, and its object is to suppress adhesion of particles to a substrate in transferring the substrate, so as to improve the yield of products manufactured in a substrate treatment system.

The present invention to attain the above object is a transfer apparatus for a substrate, including: a substrate housing container housing a substrate therein and having a transfer-in/out port for the substrate formed in a side surface thereof; a gas jet unit jetting a predetermined gas toward a rear surface of the substrate in the substrate housing container; and a control unit regulating a supply amount of the predetermined gas supplied from the gas jet unit to control the substrate in the substrate housing container to a predetermined height.

The present invention according to another aspect is a substrate treatment system having the substrate transfer apparatus and a treatment apparatus performing predetermined treatment on a substrate, the treatment apparatus including a substrate transfer mechanism delivering the substrate between the treatment apparatus and the substrate transfer apparatus.

According to the present invention, the flow rate of the gas supplied from the gas jet unit is controlled by the control unit, whereby the flow speed of the gas at the rear surface of the substrate can be controlled. Therefore, it becomes possible to raise the substrate by increasing the flow speed of the gas and to lower the substrate by decreasing the flow speed of the gas, so that the substrate can be transferred by being raised and lowered while floating in the substrate housing container. As a result, the adhesion of particles to the rear surface of the substrate which has conventionally occurred in transferring the substrate is suppressed. Thus, the yield of products manufactured in the substrate treatment system can be improved.

DETAILED DESCRIPTION OF THE INVENTION

Figure 1:
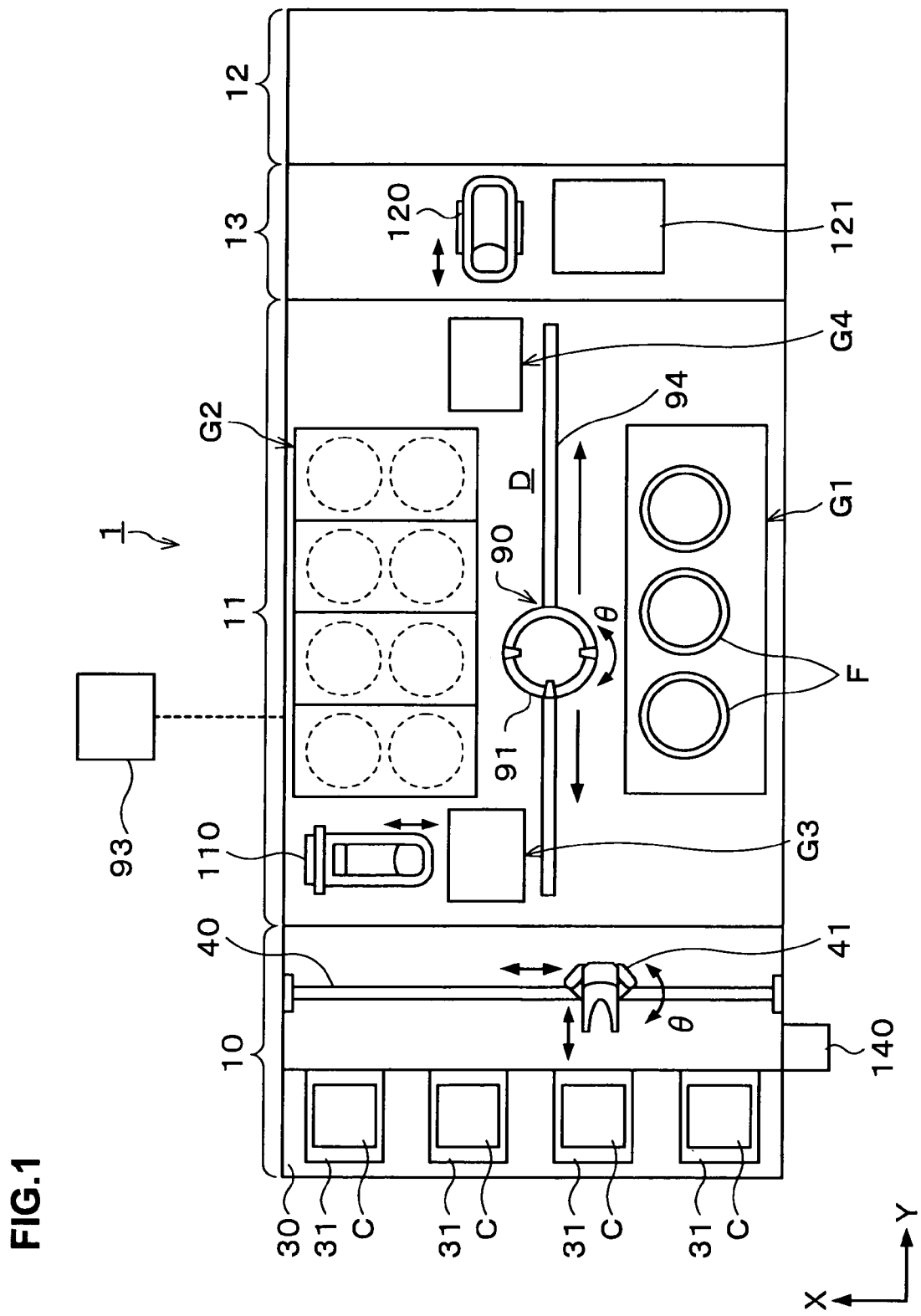
FIG. 1 is a plan view showing the outline of the internal structure of a coating and developing treatment system according to this embodiment.

Hereinafter, embodiments of the present invention will be described. FIG. 1 is an explanatory view showing the outline of a structure of a coating and developing treatment system 1 according to the present invention.

The coating and developing treatment system 1 has, as shown in FIG. 1, a structure in which, for example, a cassette station 10 into/from which cassettes C are transferred from/to the outside; a treatment station 11 including a plurality of various kinds of treatment apparatuses each for performing predetermined treatment in a manner of single-substrate treatment in photolithography processing; and an interface station 13 for delivering the substrate W to/from an aligner 12 adjacent to the treatment station 11, are integrally connected. Note that in this embodiment, for example, a semiconductor wafer is used as the substrate W.

In the cassette station 10, a cassette mounting table 30 is provided. On the cassette mounting table 30, a plurality of, for example, four cassette mounting plates 31 are provided. The cassette mounting plates 31 are provided side by side in one line in a horizontal X-direction (a top-to-bottom direction in FIG. 1). On the cassette mounting plates 31, cassettes C can be mounted when the cassettes C are transferred-in/out from/to the outside of the coating and developing treatment system 1.

In the cassette station 10, a substrate transfer body 41 is provided which is movable on a transfer path 40 extending in the X-direction as shown in FIG. 1. The substrate transfer body 41 is also movable in the vertical direction and around the vertical axis (in a θ-direction), and can transfer the substrates W between the cassettes C on the cassettes mounting plates 31 and delivery apparatuses 70 to 76 in a later-described third treatment apparatus group G3.

In the treatment station 11, a plurality of, for example, four treatment apparatus groups G1, G2, G3 and G4 each including various apparatuses are provided For example, the first treatment apparatus group G1 is provided on the front side (the negative direction side in the X-direction in FIG. 1) in the treatment station 11, and the second treatment apparatus group G2 is provided on the back side (the positive direction side in the X-direction in FIG. 1) in the treatment station 11. Further, the third treatment apparatus group G3 is provided on the cassette station 10 side (the negative direction side in a Y-direction in FIG. 1) in the treatment station 11, and the fourth treatment apparatus group G4 is provided on the interface station 13 side (the positive direction side in the Y-direction in FIG. 1) in the treatment station 11.

Figure 2:
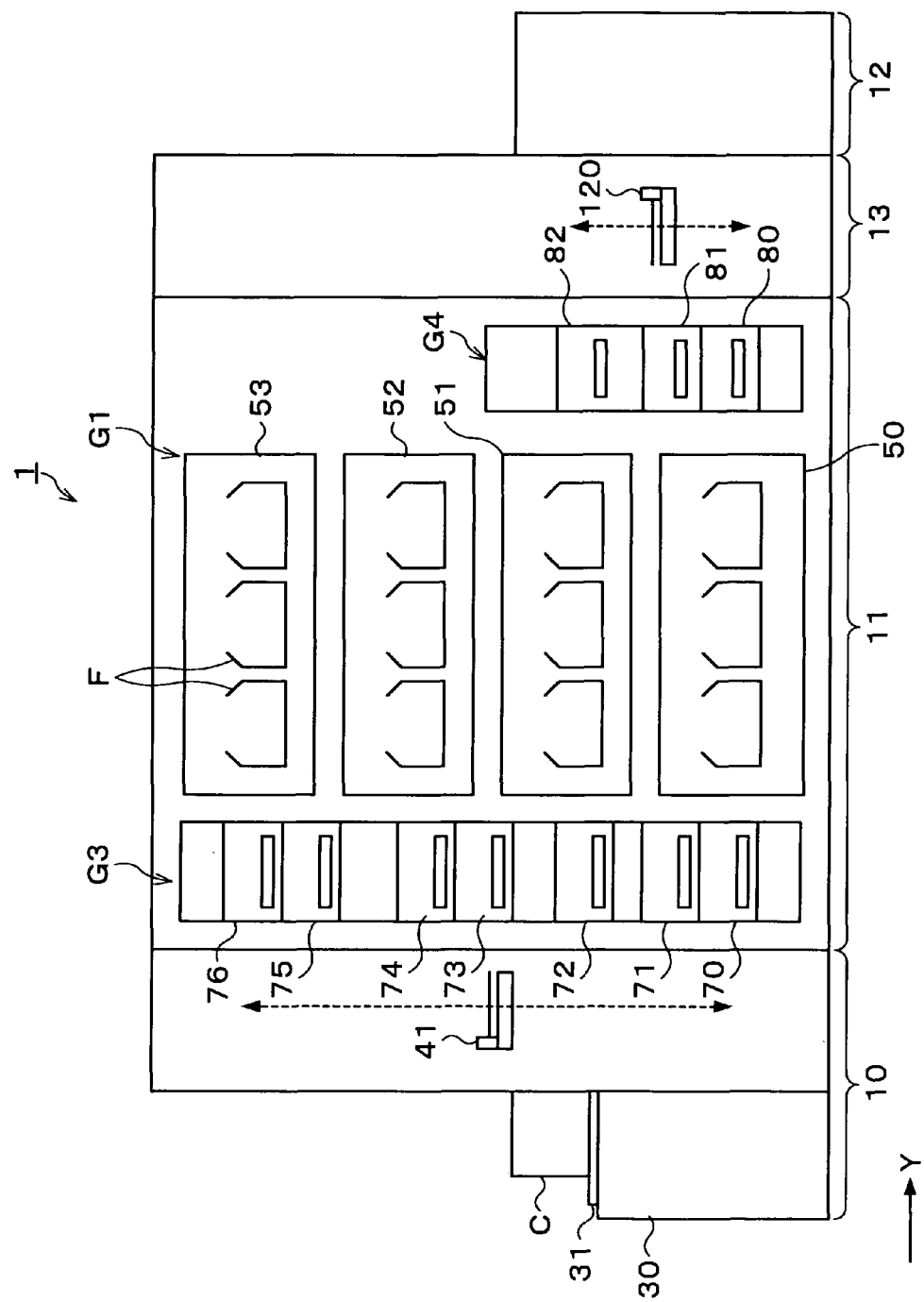
FIG. 2 is a side view showing the outline of the internal structure of the coating and developing treatment system according to this embodiment.

For example, in the first treatment apparatus group G1, a plurality of solution treatment apparatuses, for example, a developing treatment apparatus 50 performing developing treatment on the substrate W, a lower anti-reflection film forming apparatus 51 forming an anti-reflection film at a layer under a resist film on the substrate W (hereinafter, referred to as a "lower anti-reflection film"), a resist coating apparatus 52 applying a resist solution to the substrate W to form a resist film, and an upper anti-reflection film forming apparatus 53 forming an anti-reflection film at a layer on the resist film on the substrate W (hereinafter, referred to as an "upper anti-reflection film"), are four-tiered in order from the bottom as shown in FIG. 2. Note that the numbers and arrangement of the developing treatment apparatuses 50, the lower anti-reflection film forming apparatuses 51, the resist coating apparatuses 52, and the upper anti-reflection film forming apparatuses 53 can be arbitrarily selected.

For example, each of the apparatuses 50 to 53 in the first treatment apparatus group G1 has a plurality of cups F each housing a substrate W in treatment in the horizontal direction, and can treat a plurality of substrates W in parallel.

Figure 3:
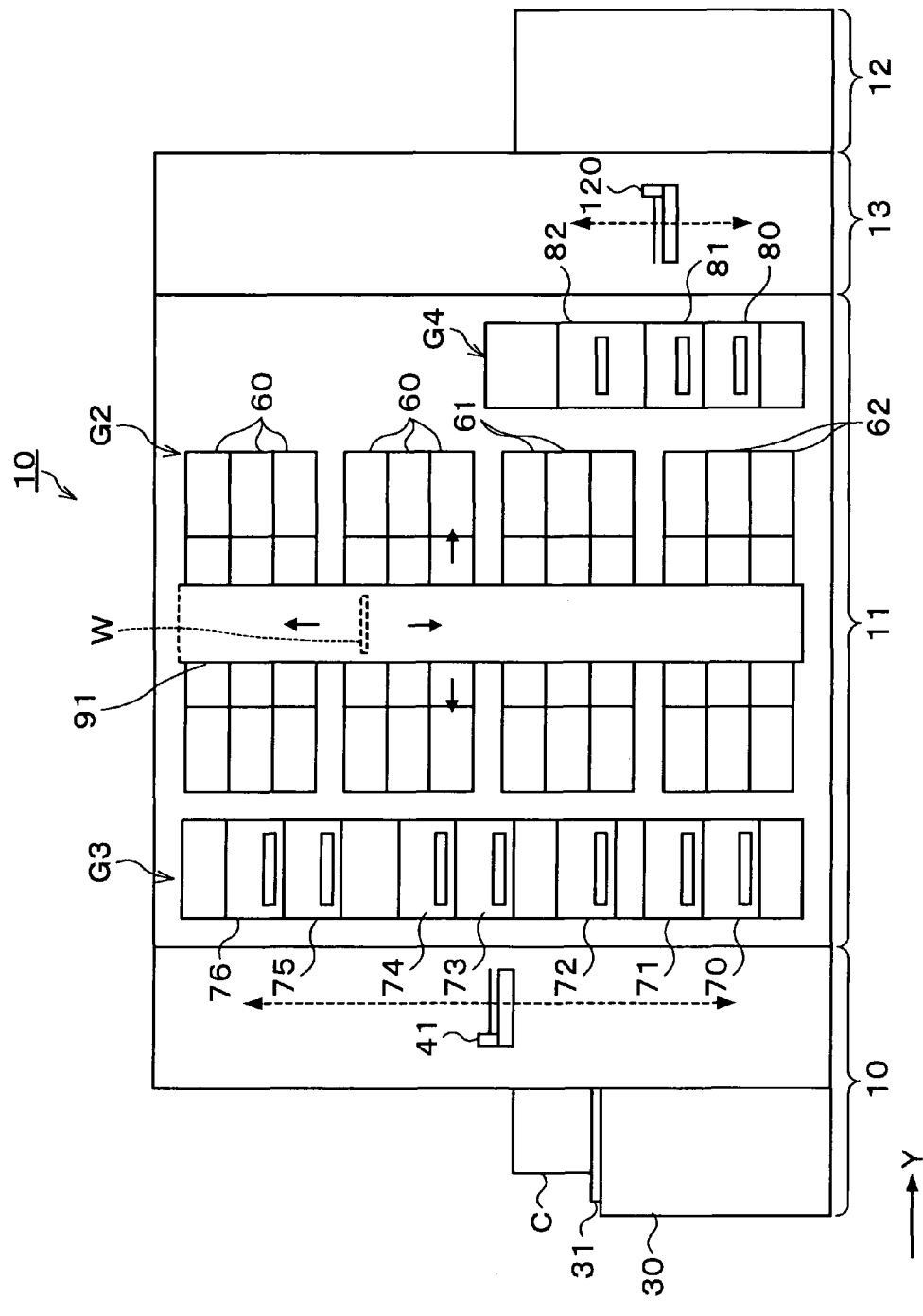
FIG. 3 is a side view showing the outline of the internal structure of the coating and developing treatment system according to this embodiment.

For example, in the second treatment apparatus group G2, thermal treatment apparatuses 60 each performing thermal treatment on the substrate W, adhesion apparatuses 61 each performing hydrophobic treatment on the substrate W, and edge exposure apparatuses 62 each exposing an outer peripheral portion the substrate W to light, are provided arranged one on top of the other in the vertical direction and side by side in the horizontal direction as shown in FIG. 3. The thermal treatment apparatus 60 has a thermal plate mounting and heating the substrate W thereon and a cooling plate mounting and cooling the substrate W thereon, and thus can perform both heating treatment and cooling treatment. Note that the numbers and arrangement of the thermal treatment apparatuses 60, the adhesion apparatuses 61, and the edge exposure apparatuses 62 can be arbitrarily selected.

For example, in the third treatment apparatus group G3, a plurality of delivery apparatuses 70, 71, 72, 73, 74, 75, and 76 are provided in order from the bottom. Further, in the fourth treatment apparatus group G4, a plurality of delivery apparatuses 80, 81, and 82 are provided in order from the bottom.

In a region surrounded by the first treatment apparatus group G1 to the fourth treatment apparatus group G4, a substrate transfer region D is formed as shown in FIG. 1. In the substrate transfer region D, for example, a substrate transfer apparatus 90 is disposed.

The substrate transfer apparatus 90 is movable, for example, in the Y-direction. Thus, the substrate transfer apparatus 90 can move in the substrate transfer region D and transfer the substrate W to a predetermined apparatus in the first treatment apparatus group G1, the second treatment apparatus group G2, the third treatment apparatus group G3, and the fourth treatment apparatus group G4 around the substrate transfer region D.

A substrate transfer body 110 is provided adjacent on the positive direction side in the X-direction to the third treatment apparatus group G3 as shown in FIG. 1. The substrate transfer body 110 has a transfer arm which is movable in the forward and backward direction, the θ-direction, and the vertical direction. The substrate transfer body 110 can move up and down while supporting the substrate W, and transfer the substrate W to each of the delivery apparatuses in the third treatment apparatus group G3.

In the interface station 13, a substrate transfer body 120 and a delivery apparatus 121 are provided. The substrate transfer body 120 has a transfer arm that is movable in the forward and backward direction, the θ-direction, and the vertical direction. The substrate transfer body 120 can support the substrate W, for example, by the transfer arm, and transfer the substrate W to each of the delivery apparatuses in the fourth treatment apparatus group G4 and the delivery apparatus 121.

Figure 4:
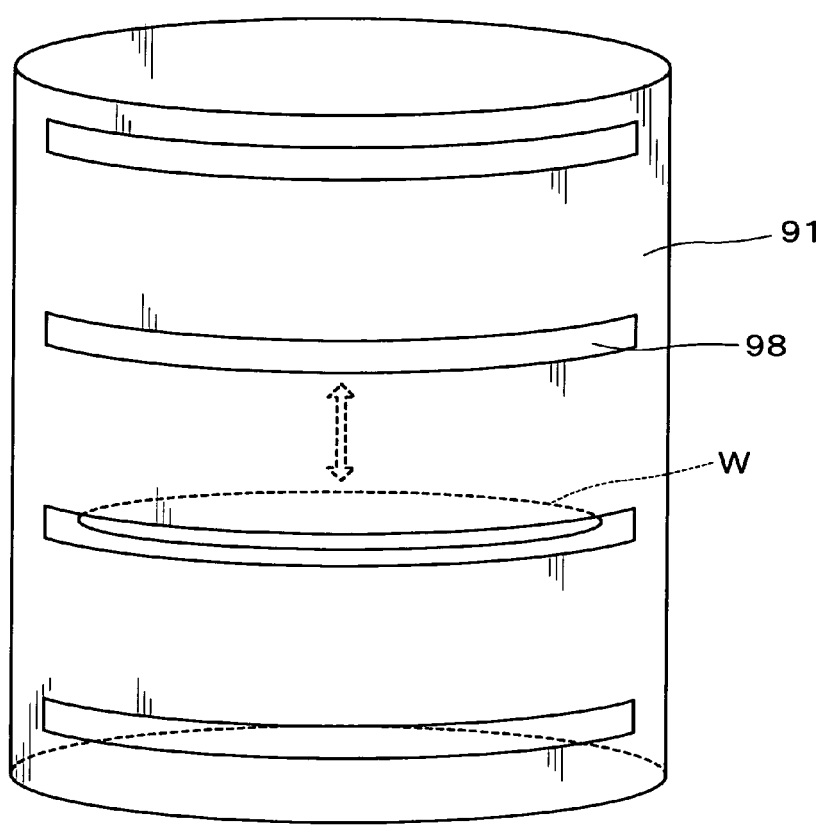
FIG. 4 is a perspective view showing the outline of the structure of a substrate housing container.

Next, the structure of the substrate transfer apparatus 90 will be described. The substrate transfer apparatus 90 has, for example as shown in FIG. 4 and FIG. 5, a substrate housing container 91 in a hollow cylindrical shape with an upper portion open, a gas jet unit 92 jetting a predetermined gas such as nitrogen, air, or the like toward a rear surface of the substrate W, a control unit 93 regulating the supply amount of the gas to be jetted from the gas jet unit 92 to control the height of the substrate W in the substrate housing container 91, and a horizontal moving mechanism 95 horizontally moving the substrate housing container 91 along an orbit 94 extending in the horizontal direction (the Y-direction in FIG. 1) in the substrate transfer region D.

Figure 6:
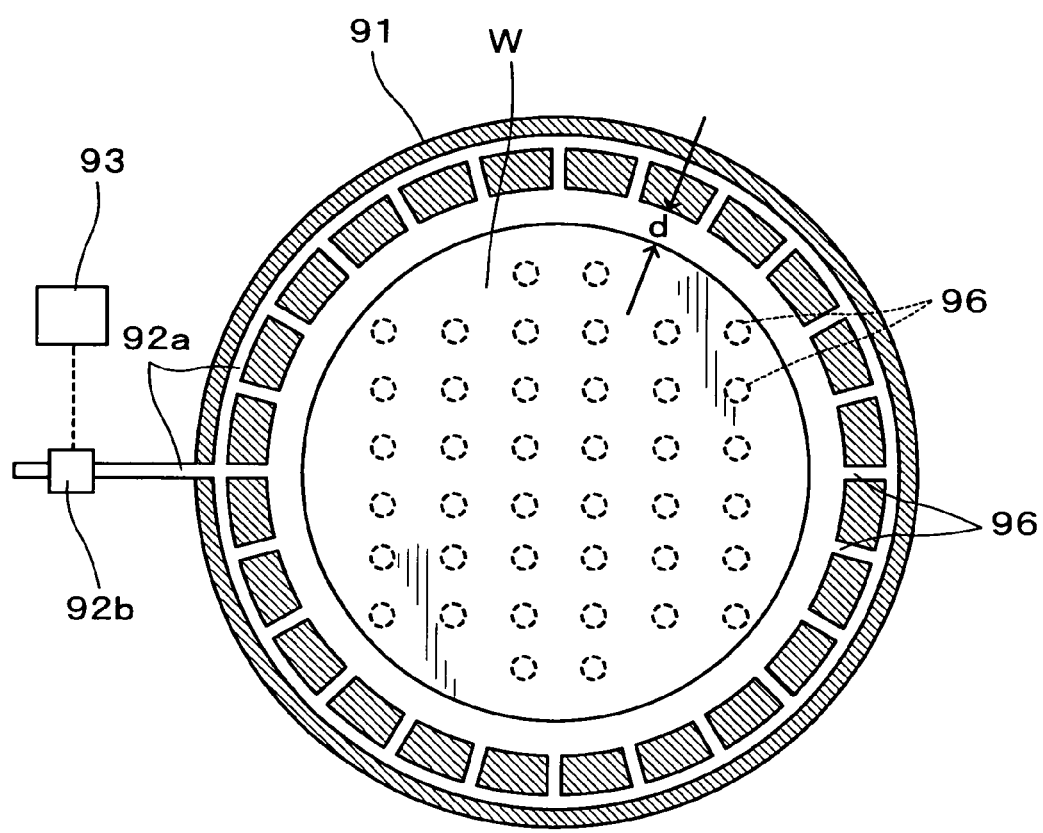
FIG. 6 is a transverse-sectional view showing the outline of the structure of the substrate housing container.

The substrate housing container 91 has, for example as shown in FIG. 6, a circular shape adapted to the outer peripheral shape of the substrate W in a plan view and having a size ensuring a distance d that is a predetermined space between the outer peripheral side surface of the substrate W and the inner side surface of the substrate housing container 91. Note that though the plane shape of the substrate housing container 91 is circular in this embodiment, in the case where the substrate W is, for example rectangular, the plane shape is formed in a rectangular shape to be adapted to the outer peripheral shape of the rectangular substrate W.

Figure 5:
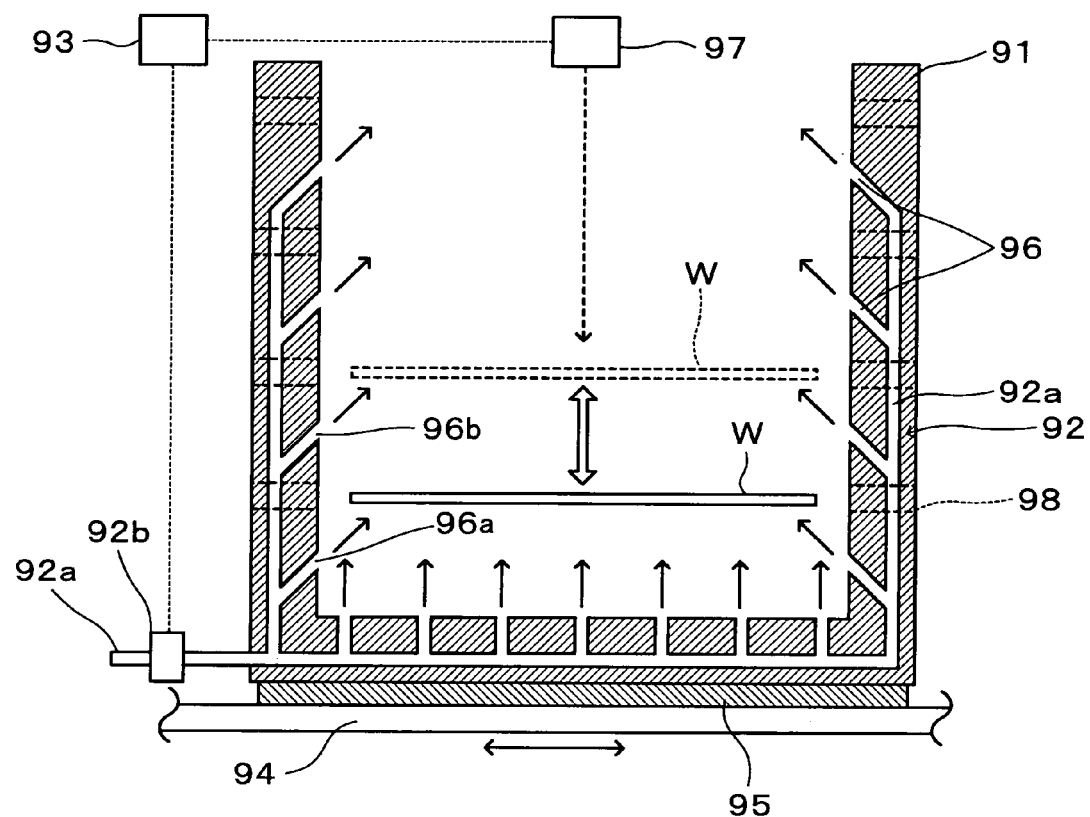
FIG. 5 is a longitudinal-sectional view showing the outline of the structure of the substrate housing container.

The gas jet unit 92 has, for example as shown in FIG. 5, a plurality of gas jet orifices 96 provided in the bottom surface and the inner side surface of the substrate housing container 91, a gas supply pipe 92a connected to the plurality of gas jet orifices 96 to supply the gas supplied from a gas supply source (not shown) to the gas jet orifices 96, and a flow rate regulating mechanism 92b provided along the gas supply pipe 92a.

The gas jet orifices 96 provided in the inner side surface of the substrate housing container 91 are opened obliquely upward, for example, to an inner surface of the substrate housing container 91 and formed to jet the gas obliquely upward. Further, the gas jet orifices 96 provided in the inner side surface of the substrate housing container 91 are formed over the whole circumference of the inner side surface of the substrate housing container 91 in the horizontal direction, and a plurality of the gas jet orifices 96 are provided at multiple tiers in the vertical direction.

The gas jet orifices 96 only need to jet the gas equally to the lower surface of the substrate W and, for example, may be provided only in the bottom surface of the substrate housing container 91 or provided only in the inner side surface of the substrate housing container 91. However, it is preferable to provide the gas jet orifices 96 both in the bottom surface and the inner side surface as shown in FIG. 5. As for the shape, the gas jet orifices 96 may be openings in a slit shape opening over the whole circumference of the inner side surface of the substrate housing container 91 or may be individual openings arranged side by side at regular intervals in the horizontal direction. Note that the gas jet orifices 96 in the case where the individual openings are arranged side by side at regular intervals are illustrated in FIG. 6.

The gas supply pipe 92a is provided, for example as shown in FIG. 5, inside a side wall and a bottom plate of the substrate housing container 91. More specifically, the gas supply pipe 92a is provided extending in the vertical direction inside the side wall of the substrate housing container 91 and extending in the horizontal direction inside the bottom plate.

The substrate W housed inside the substrate housing container 91 is housed in a state in which the substrate W is floating in the substrate housing container 91 by jetting gas at a predetermined flow rate toward the rear surface of the substrate W from the gas jet orifices 96. Further, a part of the gas jetted from the gas jet orifices 96 forms a rising current flowing through the distance d between the substrate W and the substrate housing container 91 and going out upward, so that the rising current prevents the substrate W from coming into contact with the inner side surface of the substrate housing container 91.

The substrate W held in the substrate housing container 91 can be lifted up/down in the substrate housing container 91 by regulating the supply amount of the gas from the gas jet unit 92 and increasing/decreasing the flow speed of the rising current in the substrate housing container 91 by the control unit 93.

Next, the lift up/down movement of the substrate W in the substrate housing container 91 controlled by the control unit 93 will be described. For example, to lift up the substrate W located near above gas jet orifices 96a shown in FIG. 5 to a position of gas jet orifices 96b located above them, an instruction signal to increase the supply amount of the gas to the gas jet orifices 96 is first outputted by the control unit 93 to the flow rate regulating mechanism 92b. The flow rate regulating mechanism 92b received the instruction signal increases the supply amount of the gas. This increases the flow speed of the gas flowing toward the rear surface of the substrate W to lift up the substrate W. Subsequently, when the control unit 93 senses that the substrate W has been lifted up, for example, to above the gas jet orifices 96b located above the gas jet orifices 96a, an instruction signal to set the jet amount of the gas back to the flow rate before start of the lift up of the substrate W is outputted by the control unit 93 again to the flow rate regulating mechanism 92b. Note that measurement of the position of the substrate W in the vertical direction is performed, for example, by a position measurement unit 97 provided at an upper end portion of the substrate housing container 91 and connected to the control unit 93. To lift down the substrate W, the jet amount of the gas from the gas jet orifices 96 is reduced by the control unit 93. This decreases the flow speed of the gas flowing toward the rear surface of the substrate W, so that the substrate W is lifted down. Thereafter, the position measurement unit 97 detects that the substrate W has been lifted down to a predetermined height, the control unit 93 sets the supply amount of the gas back to the flow rate before the lift down of the substrate W, and the substrate W is held at the height corresponding to the gas jet orifices 96a. This makes it possible to lift up and down the substrate W between the positions corresponding to the gas jet orifices 96.

A transfer-in/out port 98 that is an opening in a slit shape, for example as shown in FIG. 4, is provided at a height corresponding to, for example, later-described transfer-in/out units 131 and 161 of the treatment apparatuses in the treatment apparatus groups G1 to G4, in a surface of the substrate housing container 91 facing the treatment apparatuses. Through the transfer-in/out port 98, the substrate W in the substrate housing container 91 is transferred in/out between the substrate housing container 91 and the treatment apparatuses by later-described substrate transfer mechanisms 150 and 190 in the treatment apparatuses. Note that two transfer-in/out ports 98 are provided opposite each other in the side surface of the substrate housing container 91 if the treatment apparatuses are arranged, for example, with the substrate transfer apparatus 91 intervening between them as shown in FIG. 1. However, when there is no treatment apparatus at the position of the treatment apparatus group G1 in FIG. 1, the transfer-in/out port 98 only needs to be provided at only one place. Further, the gas jet orifices 96 are provided at least near below the transfer-in/out port 98 as shown in FIG. 5. This allows the substrate W to be accurately kept at the height corresponding to the transfer-in/out port 98 when the substrate W is transferred in/out. The gas flows from the gas jet orifices 96 are more stable as it is closer to the gas jet orifices 96 because the response to the control of the gas flow rate by the control unit 93 is better.

The horizontal moving mechanism 95 is provided on the upper surface of the orbit 94, for example as shown in FIG. 5, and incorporates a drive unit (not shown) moving on the orbit 94. As the drive unit of the horizontal moving mechanism 95, a linear motor is used. In this case, for example, the lower surface side of the horizontal moving mechanism 95 forms a magnet side of the linear motor, and the upper surface side of the orbit 94 forms a moving magnetic field side. Note that as the kind of the linear motor, one is selected from among an induction type, a synchronous type, a pulse type and so on according to usage, and its form is not specifically limited.

Figure 7:
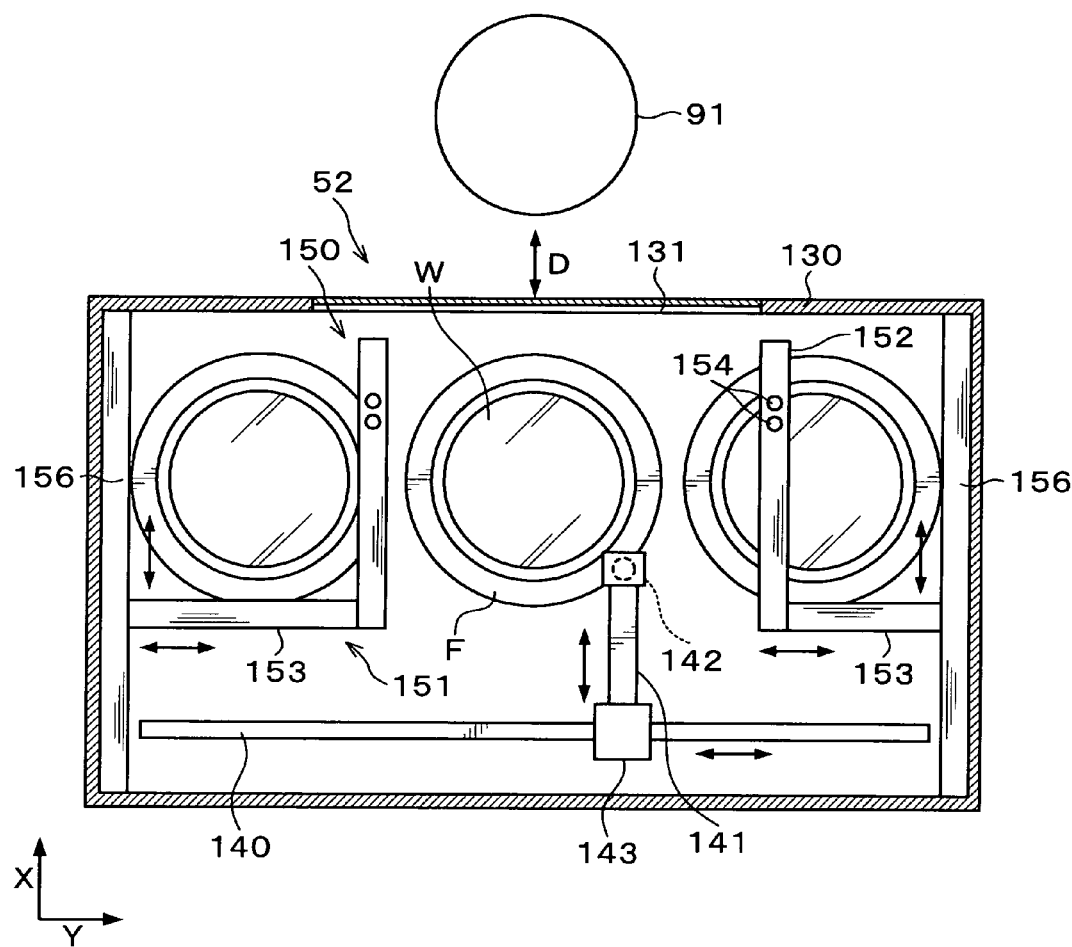
FIG. 7 is a transverse-sectional view showing the outline of the structure of a resist coating apparatus.

Next, the structure of the resist coating apparatus 52 will be described. FIG. 7 is a transverse-sectional view showing the outline of the structure of the resist coating apparatus 52, and FIG. 8 is a longitudinal sectional view showing the outline of the resist coating apparatus 52.

The resist coating apparatus 52 has a treatment container 130 capable of closing the inside thereof as shown in FIG. 7. In a surface of the treatment container 130 facing the substrate housing container 91, a transfer-in/out port 131 for the substrate W is formed.

Figure 8:
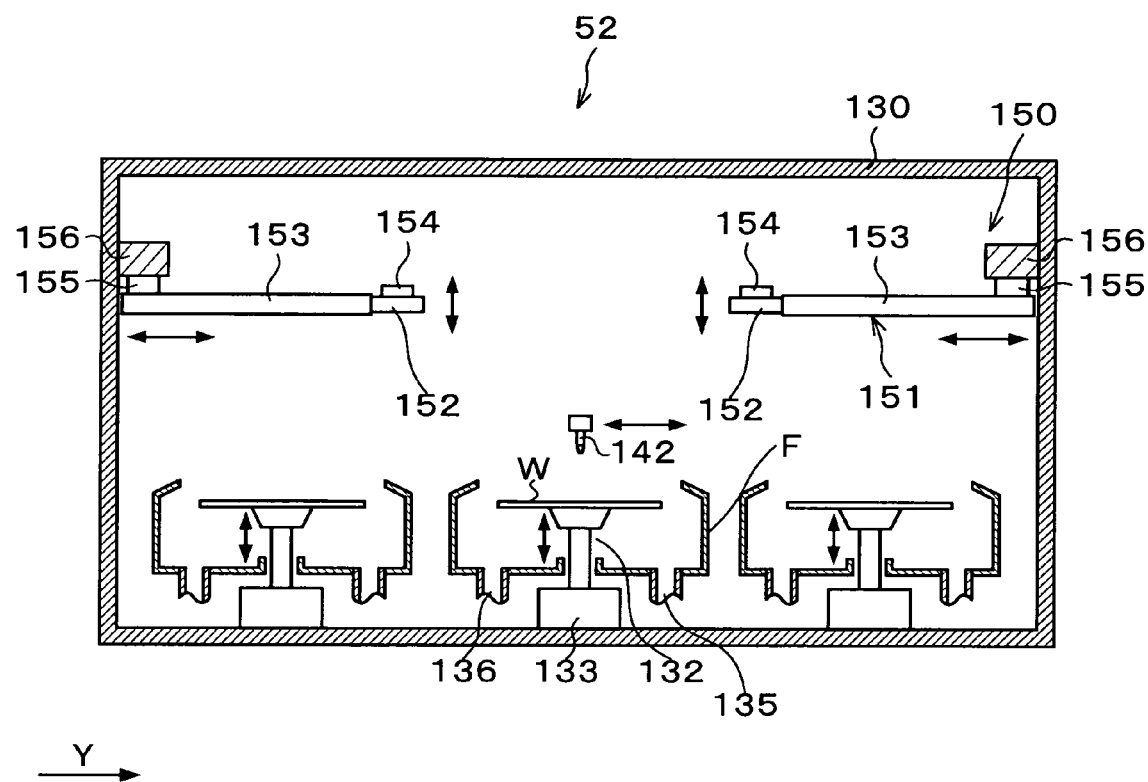
FIG. 8 is a longitudinal-sectional view showing the outline of the resist coating apparatus.

Inside the treatment container 130, spin chucks 132 each holding and rotating the substrate W thereon are provided as shown in FIG. 8. The spin chuck 132 has a horizontal upper surface, and the upper surface is provided with, for example, a suction port (not shown) for sucking the substrate W. The suction through the suction port allows the substrate W to be suction-held on the spin chuck 132.

The spin chuck 132 has a drive mechanism 133 incorporating, for example, a motor (not shown) and so on and can rotate at a predetermined speed by means of the drive mechanism 133. Further, the drive mechanism 133 is provided with a raising and lowering drive source such as a cylinder, so that the spin chuck 132 can vertically move.

Around the spin chucks 132, a plurality of cups F each receiving and collecting liquid splashing or dropping from the substrate W are provided. A drain pipe 135 draining the collected liquid and an exhaust pipe 136 exhausting the atmosphere in the cup F are connected to the bottom surface of the cup F.

As shown in FIG. 7, on the side of the negative direction in the X-direction (the downward direction in FIG. 7) of the cups F, a rail 140 is formed which extends in the Y-direction (the right-to-left direction in FIG. 7). The rail 140 is formed, for example, from the outside on the negative direction side in the Y-direction of the cups F (the left direction in FIG. 7) to the outside on the positive direction side in the Y-direction (the right direction in FIG. 7). To the rail 140, for example, an arm 141 is attached.

On the arm 141, a coating nozzle 142 for discharging the resist solution to each of the substrates W is supported. The arm 141 is movable on the rail 140 by means of a nozzle drive unit 143. Further, the arm 141 freely rises and lowers by means of the nozzle drive unit 143 to be able to adjust the height of the coating nozzle 142.

Above the spin chucks 132 in the treatment container 130, a substrate transfer mechanism 150 is provided as shown in FIG. 8. The substrate transfer mechanism 150 has a transfer arm 151 which holds and transfers the substrate W. The transfer arm 151 has, as shown in FIG. 7, a pair of arm portions 152, 152 extending in a transfer direction D of the substrate W (the X-direction in FIG. 7), and coupling portions 153 supporting the arm portions 152 and extending in an orthogonal direction (the Y-direction in FIG. 7) to the transfer direction D of the substrate W. On an upper surface of each of the arm portions 152, suction pads 154 are provided as support portions sucking and horizontally supporting the rear surface of the substrate W.

The transfer arm 151 is provided with arm moving mechanisms 155 each incorporating, for example, a motor (not shown) or the like as shown in FIG. 8. The arm moving mechanisms 155 move the coupling portions 153 in the orthogonal direction to the transfer direction D of the substrate W to thereby adjust the space between the pair of arm portions 152, 152. Further, the arm moving mechanisms 155 can also move the transfer arm 151 in the vertical direction. By the vertical movement, the transfer arm 151 can deliver the substrate W to the spin chuck 132 and receive the substrate W from the spin chuck 132.

Figure 9:
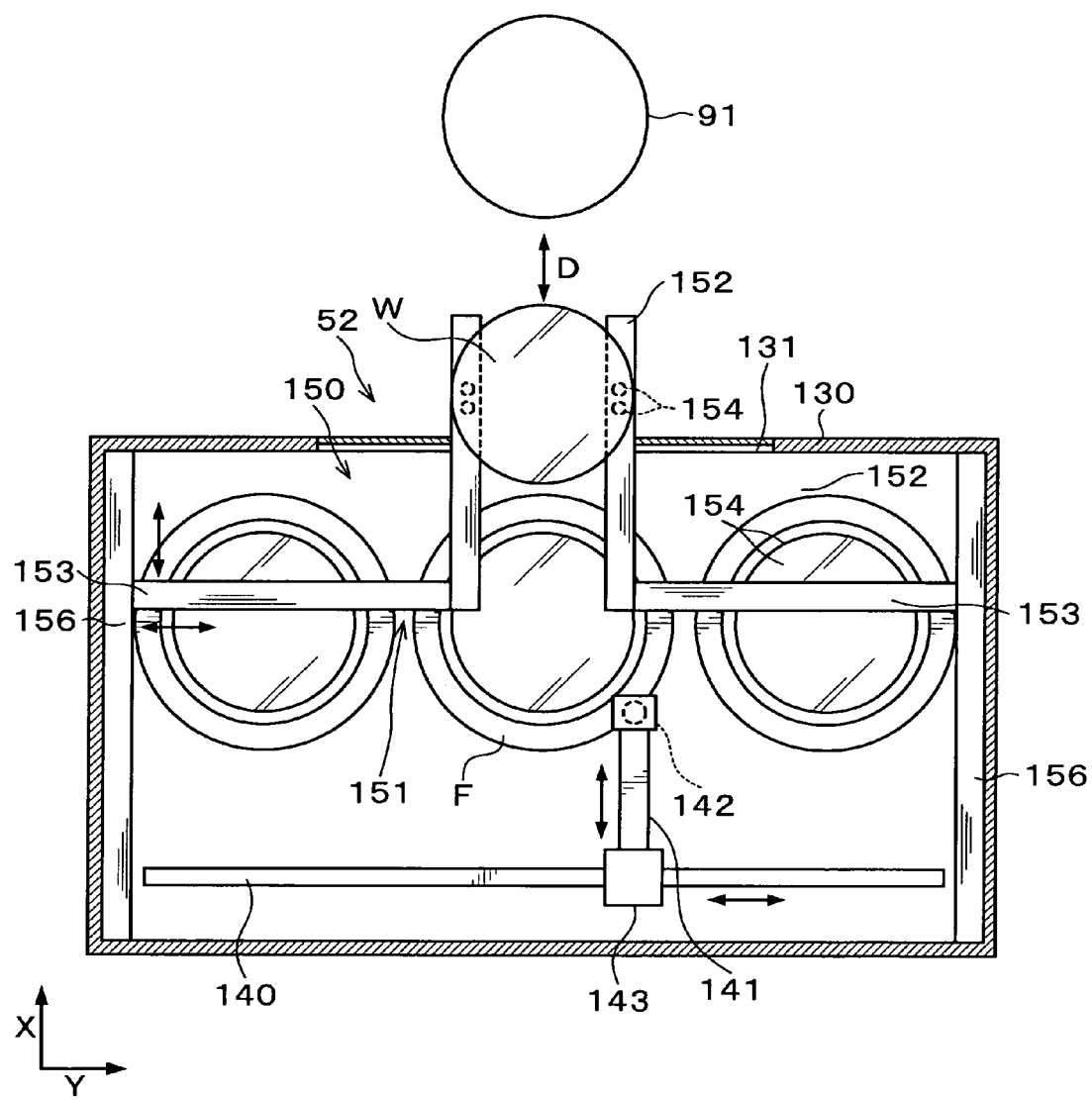
FIG. 9 is an explanatory view showing an appearance in which a substrate transfer mechanism of the resist coating apparatus transfers a substrate.

On the inner side surface of the treatment container 130, a pair of rails 156, 156 extending in the transfer direction D of the substrate W are provided as shown in FIG. 7. The arm moving mechanisms 155 are attached to the rails 156 as shown in FIG. 8 to be movable along the rails 156. By means of the arm moving mechanisms 155, the transfer arm 151 holding the substrate W can deliver the substrate W between the substrate housing container 91 and the resist coating apparatus 52 as shown in FIG. 9.

Note that each of the developing treatment apparatus 50, the lower anti-reflection film forming apparatus 51, and the upper anti-reflection forming apparatus 53 also has the same structure as that of the above-described resist coating apparatus 52 and has a substrate transfer mechanism 150. Further, the adhesion apparatus 61 also similarly has a substrate transfer mechanism 150.

Figure 10:
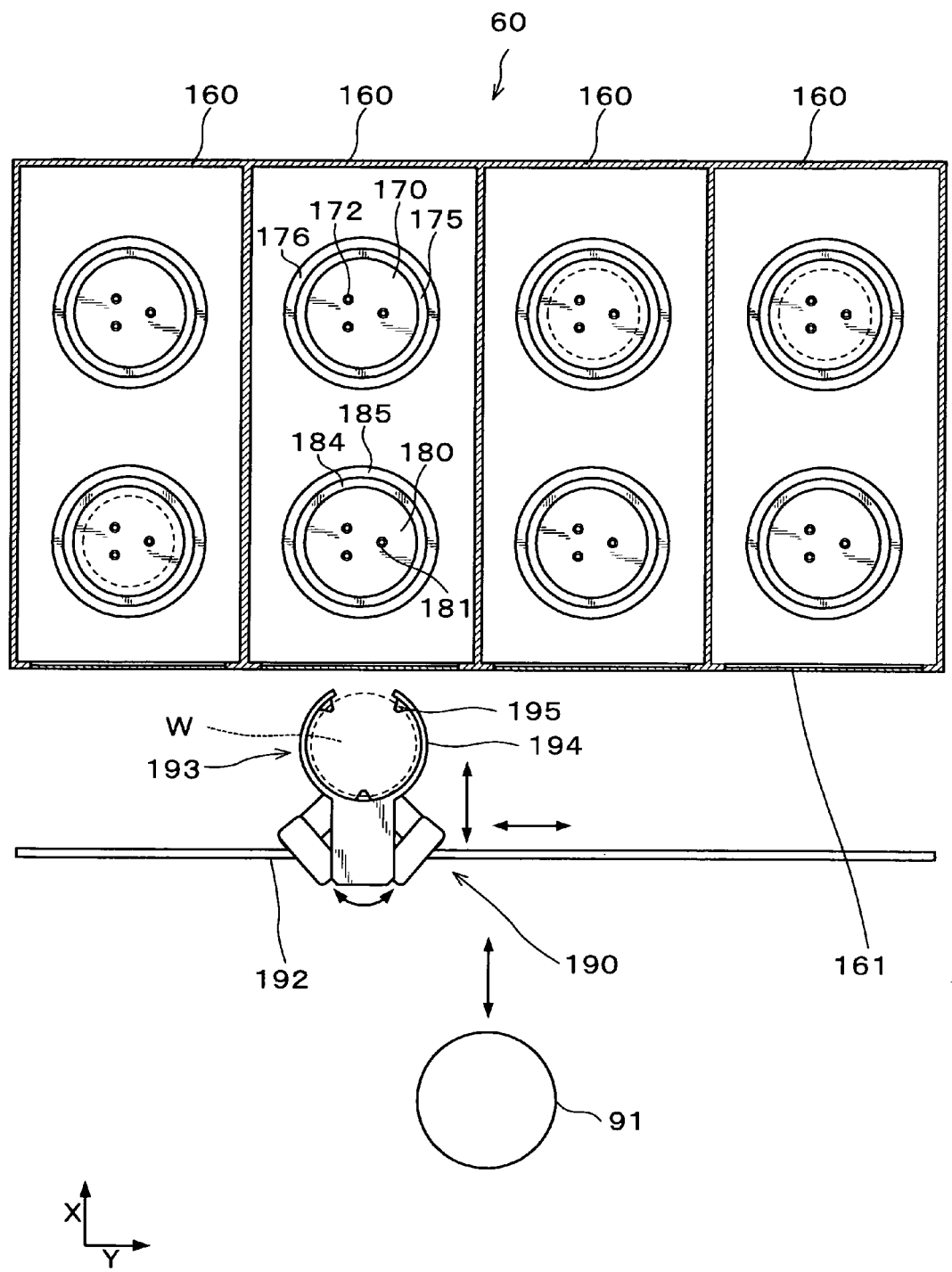
FIG. 10 is a transverse-sectional view showing the outline of the structure of a thermal treatment apparatus.
Figure 11:
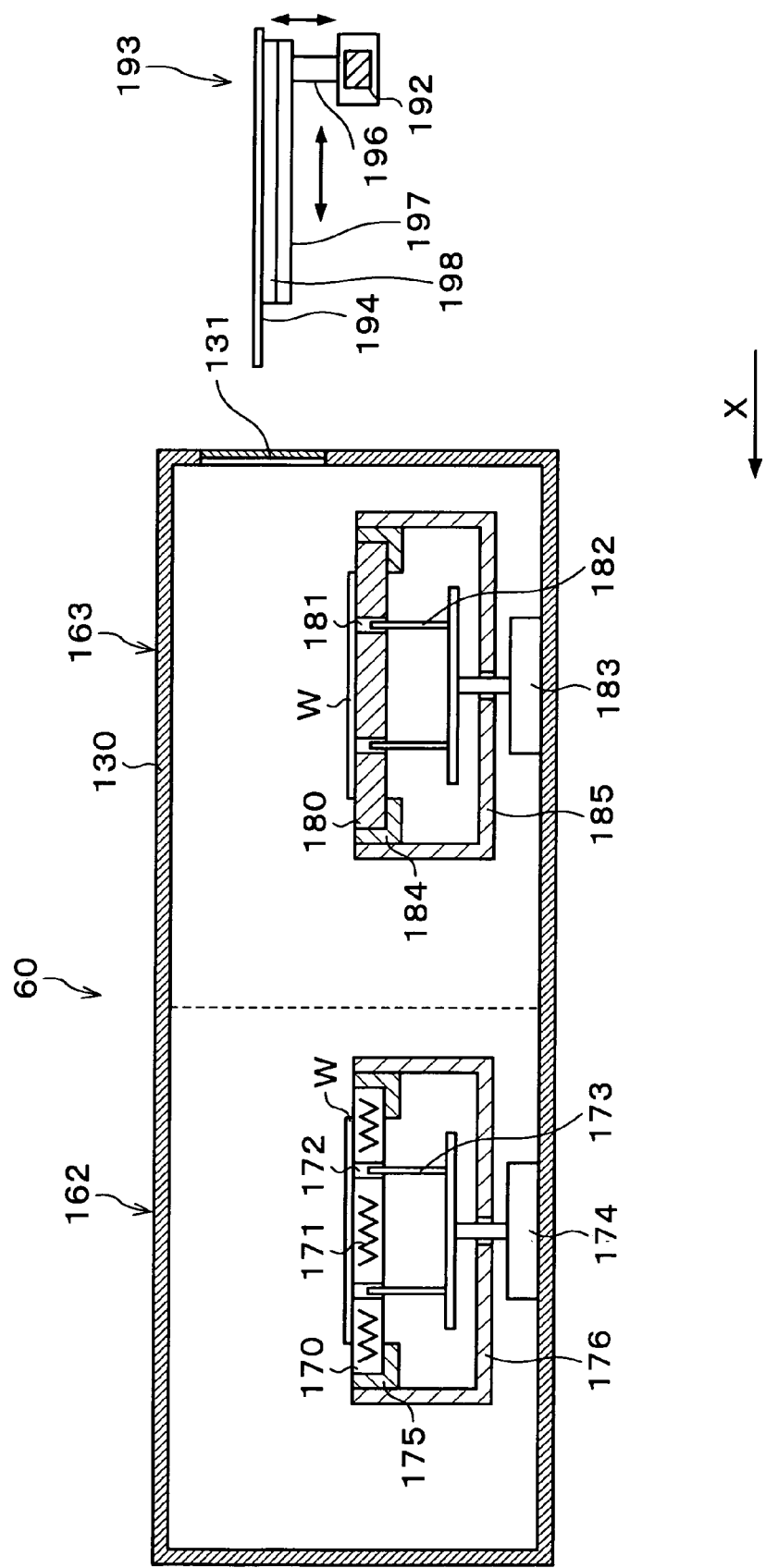
FIG. 11 is a longitudinal-sectional view showing the outline of the structure of the thermal treatment apparatus.

Next, the structure of the thermal treatment apparatus 60 will be described. FIG. 10 is a transverse-sectional view showing the outline of the structure of the thermal treatment apparatus 60, and FIG. 11 is a longitudinal-sectional view showing the outline of the structure of the thermal treatment apparatus 60.

In the thermal treatment apparatus 60, as shown in FIG. 10, four treatment containers 160 each capable of closing the inside thereof are horizontally provided along the orbit 94 of the substrate transfer apparatus 90. A transfer-in/out portion 161 for the substrate W is formed in a side surface of the treatment container 160 facing the substrate transfer apparatus 90. In a region facing the transfer-in/out portions 161, a later-described transfer path 192 is provided adjacent to the treatment containers 160. Further, the thermal treatment apparatus 60 includes a heating unit 162 performing heating treatment on the substrate W and a cooling unit 163 performing cooling treatment on the substrate W in each of the treatment containers 160 as shown in FIG. 11.

In the heating unit 162, a thermal plate 170 mounting and heating the substrate W thereon is provided. The thermal plate 170 has a substantially disk shape having a large thickness. The thermal plate 170 has a horizontal upper surface, and the upper surface is provided with, for example, a suction port (not shown) for sucking the substrate W. The suction through the suction port allows the substrate W to be suction-held on the thermal plate 170.

Inside the thermal plate 170, a heater 171 generating heat by power feeding is installed. By the generation of heat by the heater 171, the thermal plate 170 can be regulated to a predetermined set temperature.

The thermal plate 170 is formed with a plurality of through holes 172 penetrating through it in the vertical direction. In the through holes 172, raising and lowering pins 173 are provided. The raising and lowering pins 173 can vertically move by means of a raising and lowering drive mechanism 174 such as a cylinder. The raising and lowering pins 173 are inserted into the through holes 172 and project above the upper surface of the thermal plate 170 to support and raise and lower the substrate W.

For the thermal plate 170, an annular holding member 175 holding the outer peripheral portion of the thermal plate 170 is provided. The holding member 175 is provided with a cylindrical support ring 176 surrounding the outer periphery of the holding member 175 and housing the raising and lowering pins 173.

In the cooling unit 163 adjacent to the heating unit 162, a cooling plate 180 mounting and cooling the substrate W thereon is provided. The cooling plate 180 has a substantially disk shape having a large thickness. The cooling plate 180 has a horizontal upper surface, and the upper surface is provided with, for example, a suction port (not shown) for sucking the substrate W. The suction through the suction port allows the substrate W to be suction-held on the cooling plate 180.

Inside the cooling plate 180, a cooling member (not shown) such as a Peltier element or the like is incorporated and can regulate the cooling plate 180 to a predetermined set temperature.

The other structure of the cooling unit 163 is the same structure as that of the heating unit 162. More specifically, the cooling plate 180 is formed with a plurality of through holes 181 penetrating through it in the vertical direction. In the through holes 181, raising and lowering pins 182 are provided. The raising and lowering pins 182 can vertically move by means of a raising and lowering drive mechanism 183 such as a cylinder. The raising and lowering pins 182 are inserted into the through holes 181 and project above the upper surface of the cooling plate 180 to support and raise and lower the substrate W.

For the cooling plate 180, an annular holding member 184 holding the outer peripheral portion of the cooling plate 180 is provided. The holding member 184 is provided with a cylindrical support ring 185 surrounding the outer periphery of the holding member 184 and housing the raising and lowering pins 182.

Above the thermal plate 170 and the cooling plate 180, a substrate transfer mechanism 190 is provided. The substrate transfer mechanism 190 has, as shown in FIG. 10, a transfer arm 193 movable on the transfer path 192 provided in the region facing the transfer-in/out portions 161 of the treatment containers 160 and extending in the Y-direction. The transfer arm 193 has an arm portion 194 configured in a shape adapted to the outer periphery of the substrate W, for example, a shape of substantially three-fourth circle, and support portions 195 provided at the arm portion 194 for directly supporting the outer peripheral portion of the substrate W which are provided, for example, at three positions. The support portions 195 are provided at regular intervals on an inner circumference of the arm portion 194 and project inside the arm portion 194.

The transfer arm 193 is movable in the vertical direction, in the X-direction, and also around the vertical axis by means of a raising and lowering mechanism 196, a horizontal moving mechanism 197, and a rotation mechanism 198, and thus can deliver the substrate W between each of the thermal plates 170 and the cooling plates 180 in each of the treatment containers 160, and the substrate transfer apparatus 90.

Figure 12:
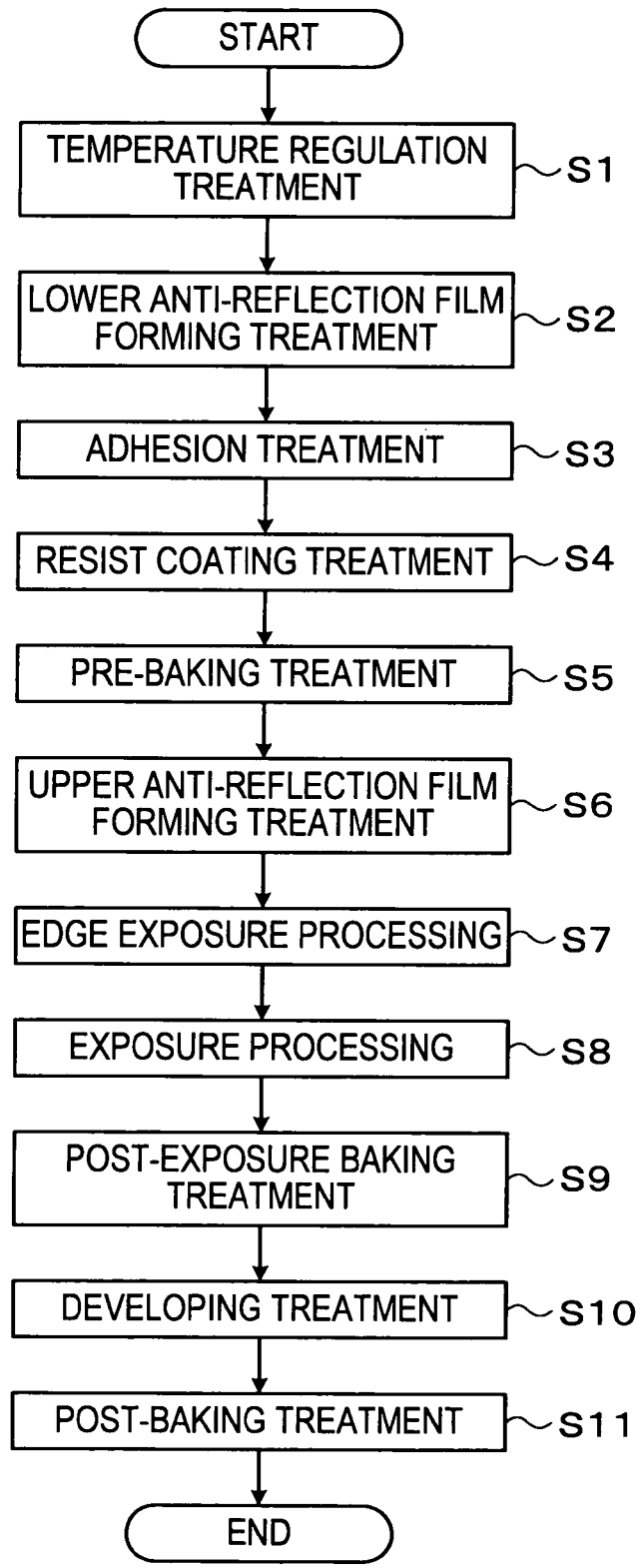
FIG. 12 is a flowchart showing processes of the substrate treatment.

In the coating and developing treatment system 1 configured as described above, for example, the following substrate treatment is performed. FIG. 12 is a flowchart showing an example of main processes of the substrate treatment.

First, a cassette C housing a plurality of substrates W is mounted on a predetermined cassette mounting plate 31 in the cassette station 10. Then, the substrates W in the cassette C are taken out in order by the substrate transfer body 41 and transferred, for example, to the delivery apparatus 73 in the third treatment apparatus group G3 of the treatment station 11.

Subsequently, the substrate W is delivered by the delivery apparatus 73 into the substrate housing container 91 through the transfer-in/out port 98 of the substrate housing container 91, and transferred to a position corresponding to the thermal treatment apparatus 60. The substrate W held in the substrate housing container 91 is transferred by the transfer arm 193 of the thermal treatment apparatus 60 entering the substrate housing container 91 through the transfer-in/out port 98, into the thermal treatment apparatus 60 and subjected to thermal treatment and temperature regulation (Step S1 in FIG. 12). Thereafter, the substrate W is delivered by the transfer arm 193 to the substrate housing container 91 and transferred, for example, to a position corresponding to the lower anti-reflection film forming apparatus 51 in the first treatment apparatus group G1. Thereafter, the substrate W is transferred by the transfer arm 151 of the lower anti-reflection film forming apparatus 51 into the lower anti-reflection film forming apparatus 51, and a lower anti-reflection film is formed on the substrate W (Step S2 in FIG. 12). Then, the substrate W is delivered by the transfer arm 151 to the substrate housing container 91, and transferred to a position corresponding to the thermal treatment apparatus 60 in the second treatment apparatus group G2. Thereafter, the substrate W is transferred by the transfer arm 193 of the thermal treatment apparatus 60 into the thermal treatment apparatus 60, and heated and temperature-regulated, and then returned to the delivery apparatus 73 in the third treatment apparatus group G3 via the transfer arm and the substrate housing container 91.

The substrate W is then transferred by the substrate transfer body 110 to the delivery apparatus 74 in the same third treatment apparatus group G3. Thereafter, the substrate W is transferred by the substrate transfer apparatus 90 to the adhesion apparatus 61 in the third treatment apparatus group G2 and subjected to adhesion treatment (Step S3 in FIG. 12). Thereafter, the substrate W is transferred by the substrate transfer apparatus 90 to the resist coating apparatus 52, and a resist film is formed on the substrate W (Step S4 in FIG. 12). Thereafter, the substrate W is transferred by the substrate transfer apparatus 90 to the thermal treatment apparatus 60, and subjected to pre-baking treatment (Step S5 in FIG. 12). Thereafter, the substrate W is transferred by the substrate transfer apparatus 90 to the delivery apparatus 75 in the third treatment apparatus group G3.

Then, the substrate W is transferred by the substrate transfer apparatus 90 to the upper anti-reflection film forming apparatus 53, and an upper anti-reflection film is formed on the substrate W (Step S6 in FIG. 12). Thereafter, the substrate W is transferred by the substrate transfer apparatus 90 to the thermal treatment apparatus 60, and heated and temperature-regulated. Thereafter, the substrate W is transferred to the edge exposure apparatus 62 and subjected to edge exposure processing (Step S7 in FIG. 12).

Thereafter, the substrate W is transferred by the substrate transfer apparatus 90 to the delivery apparatus 76 in the third treatment apparatus group G3.

Next, the substrate W is transferred by the substrate transfer body 110 to the delivery apparatus 72, and transferred by the substrate transfer apparatus 90 to the delivery apparatus 82 in the fourth treatment apparatus group G4. Thereafter, the substrate W is transferred by the substrate transfer body 120 in the interface station 13 to the aligner 12, and subjected to exposure processing (Step S8 in FIG. 12).

Then, the substrate W is transferred by the substrate transfer body 120 to the delivery apparatus 80 in the fourth treatment apparatus group G4. Thereafter, the substrate W is transferred by the substrate transfer apparatus 90 to the thermal treatment apparatus 60, and subjected to post-exposure baking treatment (Step S9 in FIG. 12). Thereafter, the substrate W is transferred by the substrate transfer apparatus 90 to the developing treatment apparatus 50, and developed (Step S10 in FIG. 12). After completion of the development, the substrate W is transferred by the substrate transfer apparatus 90 to the thermal treatment apparatus 60, and subjected to post-baking treatment (Step S11 in FIG. 12).

Thereafter, the substrate W is transferred by the substrate transfer apparatus 90 to the delivery apparatus 70 in the third treatment apparatus group G3, and then transferred by the substrate transfer body 41 in the cassette station 10 into the cassette C on the predetermined cassette mounting plate 31. Thus, a series of photolithography process is completed.

According to the above embodiment, the gas jet unit 92 is provided in the substrate housing container 91 and the flow rate of the gas jetted from the gas jet orifices 96 of the gas jet unit 92 can be controlled by the control unit 93, so that the substrate W can be raised and lowered while the substrate W is floating in the substrate housing container 91. Further, the substrate housing container 91 is configured to be horizontally movable by means of the horizontal moving mechanism 95, so that the substrate W can be transferred in the vertical and horizontal directions. Therefore, the substrate transfer apparatus 90 can transfer in/out the substrate W to/from the treatment apparatuses without coming into contact with the substrate W. Consequently, adherence of particles to the rear surface of the substrate which has conventionally occurred in transferring the substrate is suppressed. Accordingly, the yield of products manufactured in the coating and developing treatment system 1 can be improved.

Further, the substrate transfer apparatus 90 employs the linear motor as the drive source for horizontal movement, so that generation of debris due to abrasion of the drive unit can be prevented and the noise at transfer of the substrate can be reduced. Further, the transfer error of the transfer apparatus which has conventionally occurred with time due to abrasion of the drive unit can also be prevented.

Note that though the substrate transfer apparatus 90 which can hold the substrate without contact is disposed in the transfer space D in the above embodiment, the substrate transfer apparatus 90 may be used, for example, in place of each of the substrate transfer body 41 in the cassette station 10, the substrate transfer body 110 in the treatment station 11, and the substrate transfer body 120 in the interface station 13. In this case, the opportunity for the substrate W to come into contact with the arm for transfer is reduced, so that the adherence of particles to the substrate W can be further decreased.

Though one substrate transfer apparatus 90 is provided in the coating and developing treatment system 1 in the above embodiment, a plurality of substrate transfer apparatuses 90 may be provided, for example, one above the other. Then, the plurality of substrate transfer apparatuses 90 may be used to transfer substrates W to predetermined treatment apparatuses at the similar heights in the treatment apparatus groups G1 to G4 respectively.

Figure 13:
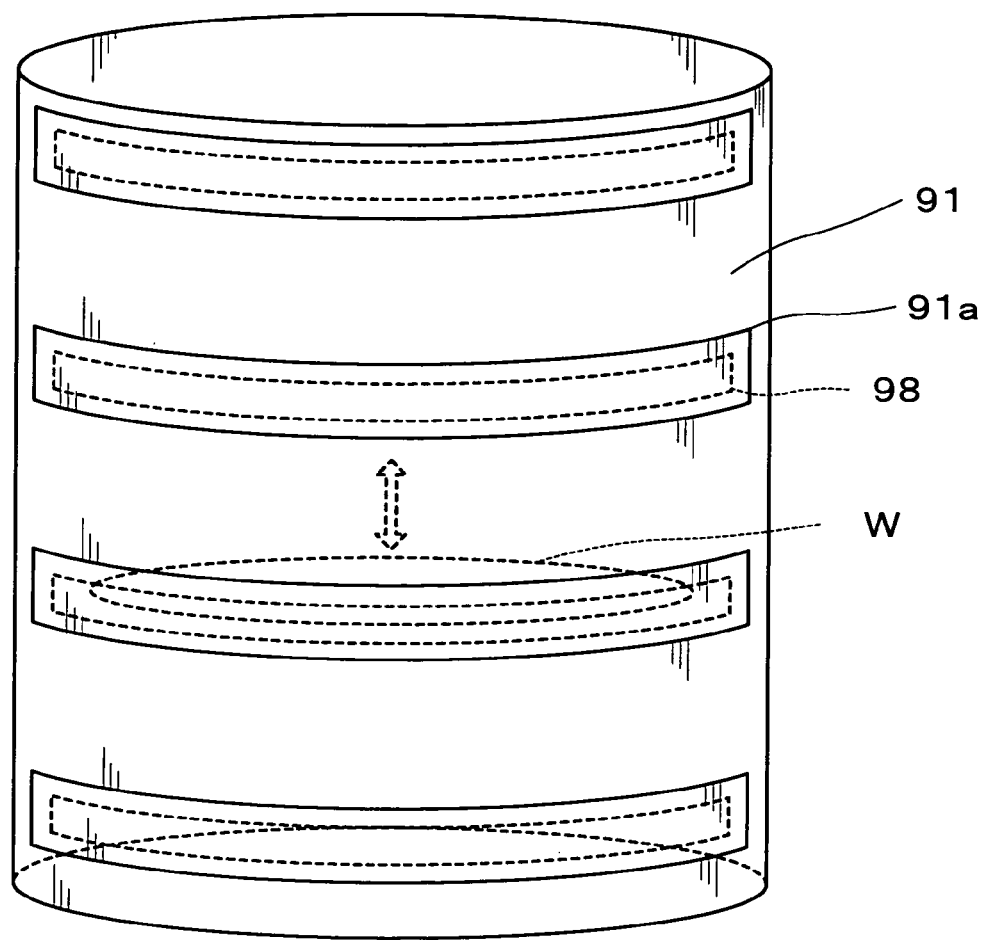
FIG. 13 is a perspective view showing the outline of the structure of a substrate housing container according to another embodiment.

Further, a shutter 91a may be provided at each of the transfer-in/out ports 98 of the substrate housing container 91, for example as shown in FIG. 13. In this case, the shutter 91a are closed except the time when the substrate W is transferred in/out to/from the substrate housing container 91, whereby the leakage of the gas to the outside of the substrate housing container 91 through the transfer-in/out ports 98 can be minimized. Accordingly, the amount of gas to be supplied into the substrate housing container 91 can be saved. Further, the leakage of the gas from the transfer-in/out ports 98 causes a turbulent flow in the rising current in the substrate housing container 91, and the substrate W held therein may vertically move for example. In contrast, in this embodiment, the leakage of the gas to the outside of the substrate housing container 91 can be minimized by providing the shutters 91a, thereby suppressing the turbulent flow. This makes it possible to stably hold the substrate W. Note that the opening/closing direction of the shutters can be arbitrarily determined.

Figure 14:
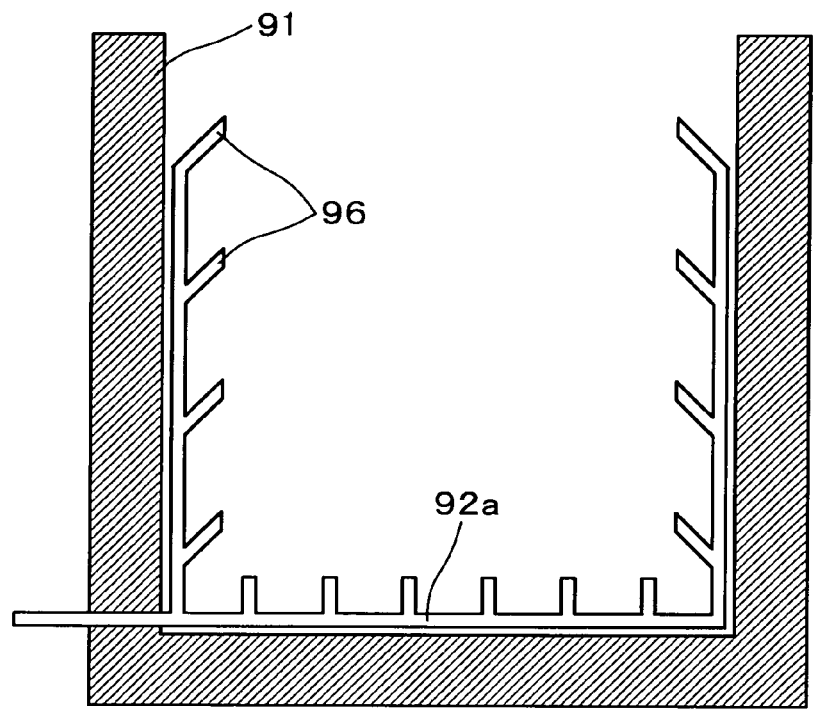
FIG. 14 is a longitudinal-sectional view showing the outline of the structure of a substrate housing container according to another embodiment.
Figure 15:
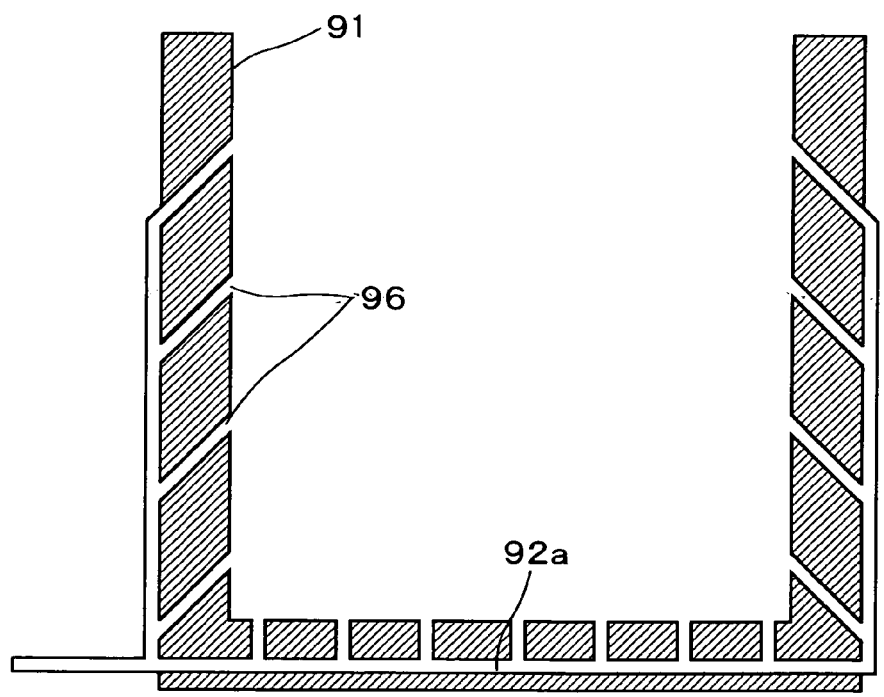
FIG. 15 is a longitudinal-sectional view showing the outline of the structure of a substrate housing container according to another embodiment.

Though the gas supply pipe 92a is disposed extending in the vertical direction inside the side wall of the substrate housing container 91 in the above embodiment, the gas supply pipe 92a may be extended in the vertical direction inside the substrate housing container 91, for example as shown in FIG. 14. In this case, the gas supply ports 96 are disposed inside the substrate housing container 91. Further, the gas supply pipe 92a may be extended in the vertical direction outside the substrate housing container 91 as shown in FIG. 15.

Figure 16:
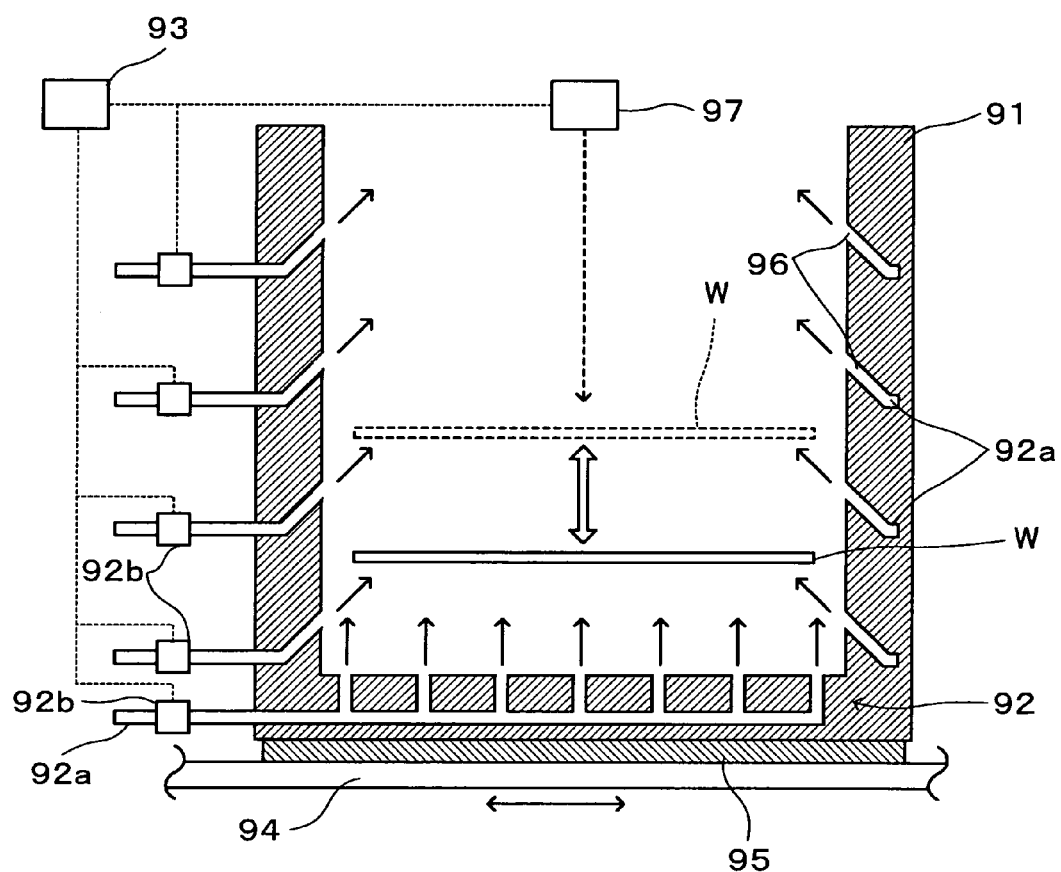
FIG. 16 is a longitudinal-sectional view showing the outline of the structure of a substrate housing container according to another embodiment.

Though the one flow rate regulating mechanism 92b is provided at the gas supply unit 92 in the above embodiment, flow rate regulating mechanisms 92b may be individually provided along gas supply pipes 92a connected to the gas jet orifices 96 at respective heights as shown in FIG. 16. In this case, for example, to hold the substrate W at a predetermined height in the substrate housing container 91, gas only needs to be jetted from the gas jet orifices 96 at the height corresponding to the substrate W. In other words, it is unnecessary to jet gas from the other gas jet orifices 96, so that the amount of gas to be supplied into the substrate housing container 91 can be saved.

Figure 17:
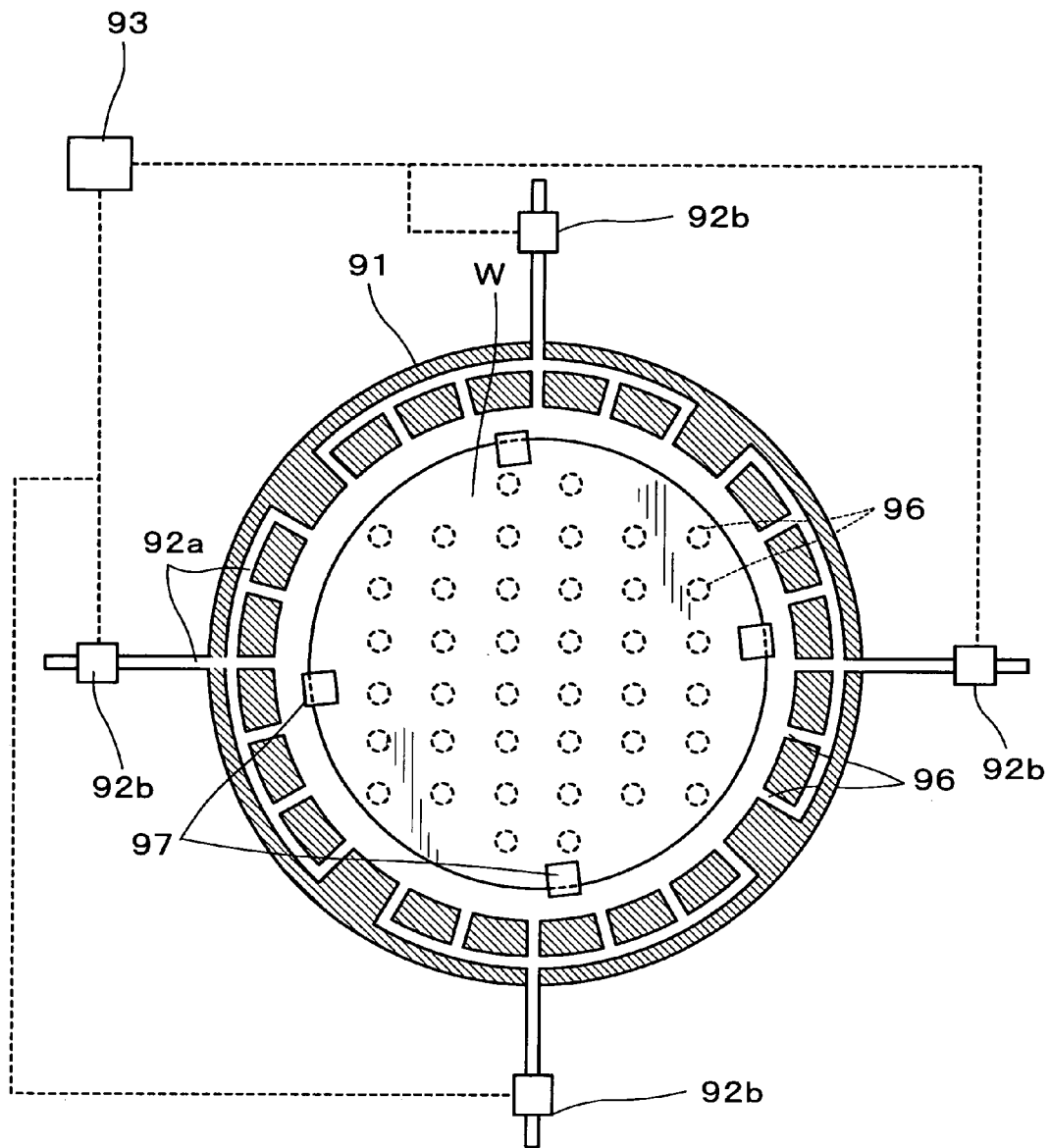
FIG. 17 is a transverse-sectional view showing the outline of the structure of a substrate housing container according to another embodiment.

Though the provision of the flow rate regulating mechanisms 92b for the gas jet orifices 96 at the respective heights is discussed in the above embodiment, the gas jet orifices 96 may be provided, for example as shown in FIG. 17, as blocks different for every pitch of 90 degrees, the blocks of the jet orifices 96 are individually connected to the gas supply pipes 92a respectively, and the flow rate regulating mechanisms 92b may be individually provided along the gas supply pipes 92a. In this case, for example, the position measurement units 97 are disposed at four positions with a pitch of 90 degrees on the upper surface of the substrate housing container 91, and the positions in the height direction of the outer peripheral portions of the substrate W are measured by the respective position measurement units 97 to judge whether or not the substrate W is tilted. For example, if the substrate W is tilted, the jet amounts of the gas from the flow rate regulating mechanisms 92b can be regulated based on the measurement results of the position measurement units 97 to horizontally hold the substrate W. Further, in such a structure, the inner surface shape of the substrate housing container 91 does not need to always follow the shape of the substrate W, and the substrate can be held horizontally by controlling the supply amount to the gas jet orifices in each of the blocks.

Figure 18:
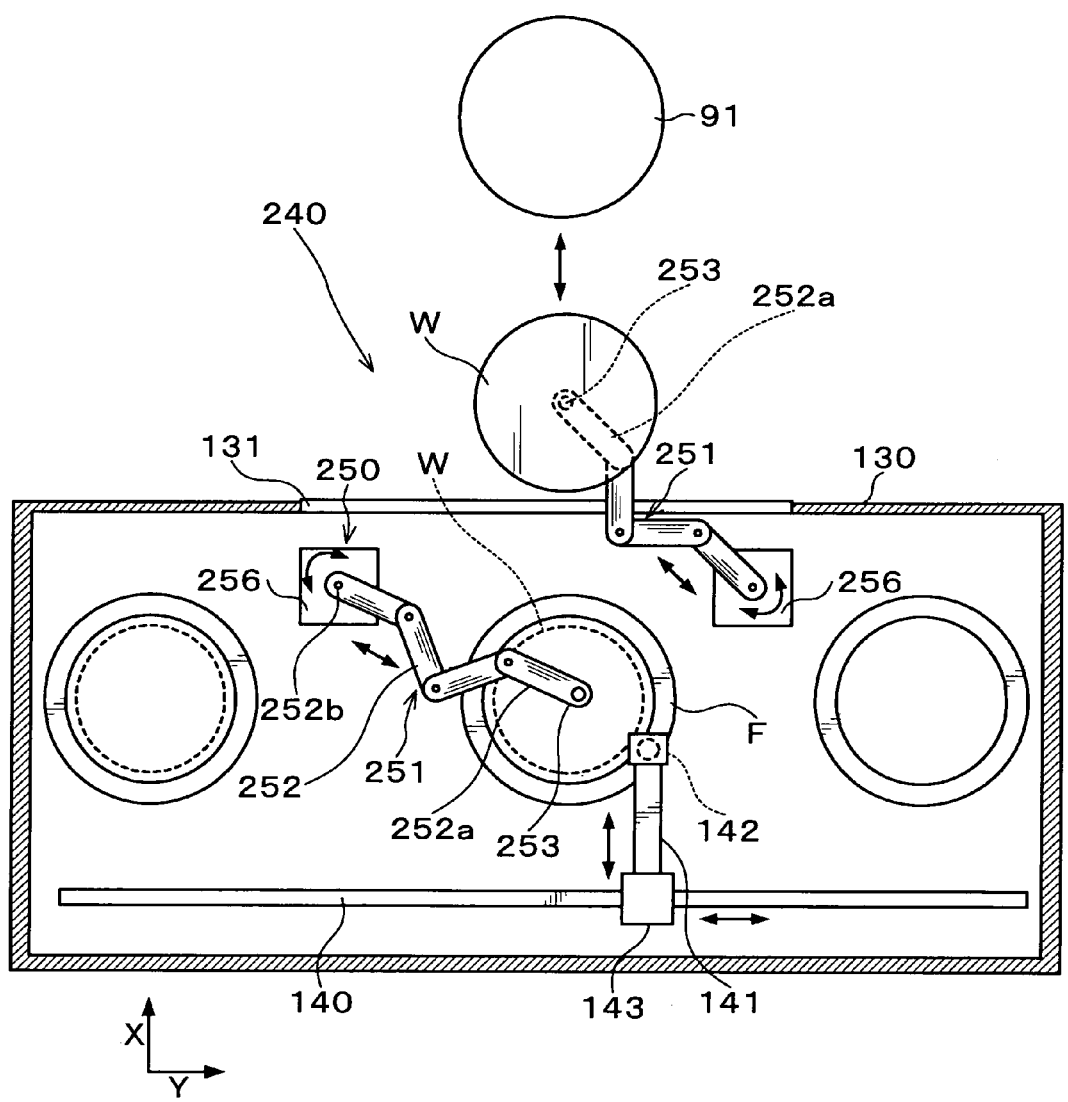
FIG. 18 is a transverse-sectional view showing the outline of the structure of a resist coating apparatus according to another embodiment.
Figure 19:
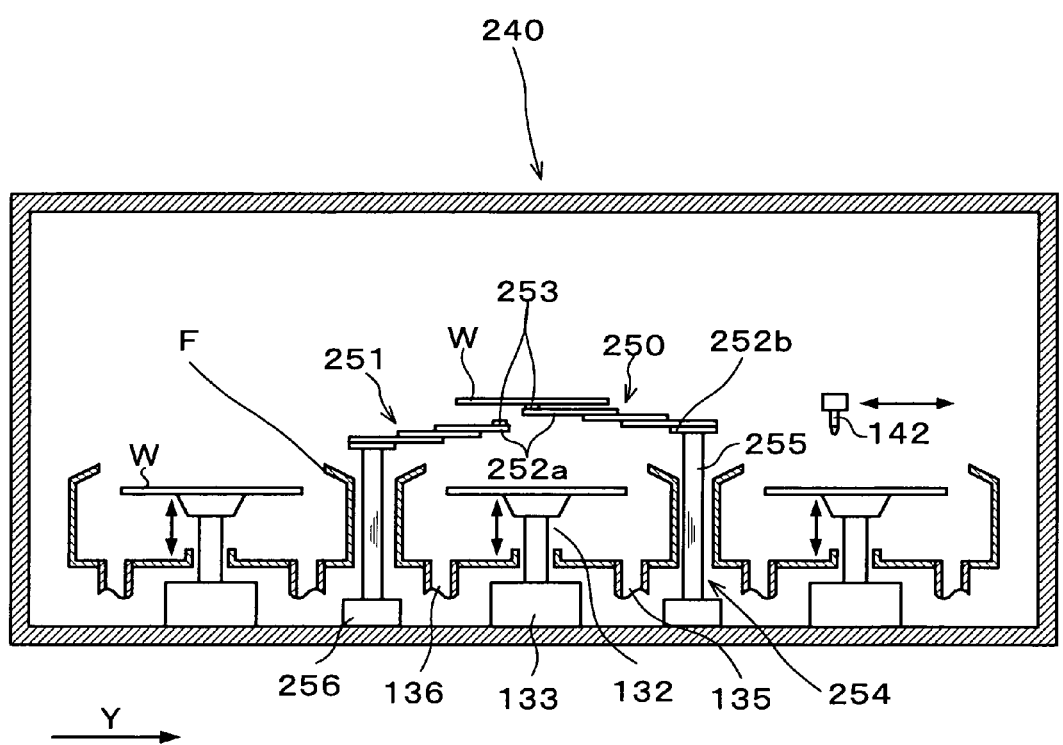
FIG. 19 is a longitudinal-sectional view showing the outline of the structure of the resist coating apparatus according to the other embodiment.

Further, for example, the resist coating apparatus 240 may have a transfer mechanism 250 having another structure as shown in FIG. 18 and FIG. 19 in place of the above-described transfer mechanism 150. The substrate transfer mechanism 250 has, for example, two articulated transfer arms 251 each holding and transferring the substrate W. Each of the transfer arms 251 has a plurality of, for example, four arm portions 252. One arm portion 252 among the four arm portions 252 is foldably coupled to the other arm portion 252 at its end. Between the arm portions 252, a motive power is transmitted so that the transfer arm 251 can fold and stretch and turn. At an arm portion 252a at the tip, a suction pad 253 is provided as a holding portion sucking and horizontally holding the rear surface of the substrate W.

On a lower surface of an arm portion 252b on the base end, an arm moving mechanism 254 is provided. The arm moving mechanism 254 has a shaft 255 supporting the arm portion 252b, and a drive mechanism 256 provided under the shaft 255 and incorporating, for example, a motor (not shown). By the arm moving mechanism 254, the transfer arm 251 can move in the vertical direction to change the position in the height direction of the transfer arm 251 so that the transfer arms 251 interfere with each other when the transfer arm 251 holds the substrate W and the transfer arm 251 moves. Further, the transfer arm 251 can transfer the substrate W between the plurality of cups F and the substrate transfer apparatus 91.

Note that the combination of the above-described transfer mechanisms 150, 190, and 250 and the treatment apparatuses is not limited to that in this embodiment, but they are also applicable to other treatment apparatuses.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention can take not only this example but take various forms. The present invention is also applicable to the case where the substrate is other substrates such as an FPD (Flat Panel Display), a mask reticle for a photomask, and the like other than the wafer. Further, the present invention is applicable to the case where the treatment performed in the treatment apparatus is plasma treatment other than the CVD treatment, for example, etching treatment, and is also applicable to treatments other than the plasma treatment. Further, the present invention is applicable not only to the transfer arm of the shape in the embodiment, but also to various transfer arms.

The present invention is useful in transferring a substrate to a treatment apparatus performing predetermined treatment on the substrate.

What is claimed is:

1. A transfer apparatus for a substrate, which transfers the substrate between processing apparatuses, comprising:
   a substrate housing container housing a substrate therein and having a plurality of transfer-in/out ports for the substrate formed in a side surface thereof;
   a gas jet unit jetting a predetermined gas toward a rear surface of the substrate in said substrate housing container; and
   a control unit regulating a supply amount of the predetermined gas supplied from said gas jet unit to control the substrate in said substrate housing container to a predetermined height, wherein
   the plurality of said transfer-in/out ports are formed in a vertical direction in a side surface of said substrate housing container,
   said gas jet unit has a plurality of gas jet orifice jetting the predetermined gas obliquely upward from an inner side surface of said substrate housing container,
   the plurality of said gas jet orifices are provided in number and at positions matching the plurality of said transfer-in/out ports and are provided over a whole circumference of the inner side surface of said substrate housing container.

2. A transfer apparatus for a substrate, which transfers the substrate between processing apparatuses, comprising:
   a substrate housing container housing a substrate therein and having a transfer-in/out port for the substrate formed in a side surface thereof;
   a gas jet unit having a plurality of gas jet orifices vertically oriented and obliquely faced, the gas get unit jetting a predetermined gas toward a rear surface of the substrate in said substrate housing container;
   a control unit regulating a supply amount of the predetermined gas supplied from said gas jet unit to control the substrate in said substrate housing container to a predetermined height, and
   a position measurement unit measuring a height of the substrate in said substrate housing container,
   wherein said control unit regulates the supply amount of the predetermined gas to move the substrate to the predetermined height based on the height of the substrate measured by said position measurement unit.

3. The substrate transfer apparatus as set forth in claim 1, wherein a plurality of said gas jet orifices are provided in a vertical direction.

4. The substrate transfer apparatus as set forth in claim 3, wherein said control unit regulates a supply amount of the predetermined gas supplied from each of said gas jet orifices.

5. The substrate transfer apparatus as set forth in claim 3, wherein a gas supply pipe supplying the predetermined gas to said plurality of gas jet orifices is connected to said plurality of gas jet orifices, and
   wherein said gas supply pipe extends in the vertical direction inside said substrate housing container.

6. The substrate transfer apparatus as set forth in claim 3, wherein a gas supply pipe supplying the predetermined gas to said plurality of gas jet orifices is connected to said plurality of gas jet orifices, and
   wherein said gas supply pipe extends in the vertical direction outside said substrate housing container.

7. The substrate transfer apparatus as set forth in claim 3, wherein a gas supply pipe supplying the predetermined gas to said plurality of gas jet orifices is connected to said plurality of gas jet orifices, and
   wherein said gas supply pipe extends in the vertical direction inside a side wall of said substrate housing container.

8. The substrate transfer apparatus as set forth in claim 2, wherein the plurality of said gas jet orifices jet the predetermined gas obliquely upward from an inner side surface of said substrate housing container.

9. The substrate transfer apparatus as set forth in claim 8, wherein the plurality of said gas jet orifices are provided over a whole circumference of the inner side surface of said substrate housing container.

10. The substrate transfer apparatus as set forth in claim 8, wherein the plurality of said gas jet orifices are provided in a vertical direction.

11. The substrate transfer apparatus as set forth in claim 10, wherein said control unit regulates a supply amount of the predetermined gas supplied from each of said gas jet orifices.

12. The substrate transfer apparatus as set forth in claim 10, wherein a gas supply pipe supplying the predetermined gas to said plurality of gas jet orifices is connected to said plurality of gas jet orifices, and
    wherein said gas supply pipe extends in the vertical direction inside said substrate housing container.

13. The substrate transfer apparatus as set forth in claim 10, wherein a gas supply pipe supplying the predetermined gas to said plurality of gas jet orifices is connected to said plurality of gas jet orifices, and
    wherein said gas supply pipe extends in the vertical direction outside said substrate housing container.

14. The substrate transfer apparatus as set forth in claim 10, wherein a gas supply pipe supplying the predetermined gas to said plurality of gas jet orifices is connected to said plurality of gas jet orifices, and
    wherein said gas supply pipe extends in the vertical direction inside a side wall of said substrate housing container.

* * * * *